United States Patent
Wong et al.

(10) Patent No.: US 7,795,976 B2
(45) Date of Patent: Sep. 14, 2010

(54) SLEW-RATE-ENHANCED ERROR AMP WITH ADAPTIVE TRANSCONDUCTANCE AND SINGLE DOMINANT POLE SHARED BY MAIN AND AUXILIARY AMPS

(75) Inventors: Yat To William Wong, Hong Kong (HK); Chik Wai David Ng, Hong Kong (HK); Ho Ming Karen Wan, Hong Kong (HK); Kam Chuen Wan, Hong Kong (HK); Kwok Kuen David Kwong, Davis, CA (US)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 36 days.

(21) Appl. No.: 12/345,862

(22) Filed: Dec. 30, 2008

(65) Prior Publication Data

US 2010/0164625 A1  Jul. 1, 2010

(51) Int. Cl.
 *H03F 3/45* (2006.01)
(52) U.S. Cl. .................................. 330/255; 330/257
(58) Field of Classification Search .............. 330/253, 330/255, 257
See application file for complete search history.

(56) References Cited

U.S. PATENT DOCUMENTS

| | | | |
|---|---|---|---|
| 5,070,307 A | 12/1991 | Ta | |
| 5,343,164 A | 8/1994 | Holmdahl | |
| 5,512,859 A * | 4/1996 | Moraveji | 330/267 |
| 6,456,161 B2 | 9/2002 | Smith | |
| 6,771,126 B2 | 8/2004 | Blankenship et al. | |
| 7,164,298 B2 | 1/2007 | Sung | |

* cited by examiner

*Primary Examiner*—Robert Pascal
*Assistant Examiner*—Khiem D Nguyen
(74) *Attorney, Agent, or Firm*—Stuart T. Auvinen; gPatent LCL

(57) ABSTRACT

An error amplifier can be used to control a power regulator transistor. The error amplifier has a main amplifier, a pull-up auxiliary amplifier, and a pull-down auxiliary amplifier that all drive an output. A compensating capacitor on the output sets a single dominant pole for all amplifiers, increasing stability. High slew rates are provided by increased slew current from the auxiliary amplifiers that turn on when the differential input has an absolute voltage difference larger than an intentional offset. The intentional offset is introduced into the auxiliary amplifiers by adjusting a p-channel to n-channel transistor ratio in a leg of the auxiliary amplifiers. A source degenerated resistor in the main amplifier reduces supply headroom and increases linearity by connecting sources of two differential transistors that receive the differential input. Cascode transistors increase gain and output impedance. Reliability is increased as no positive feedback is used in the amplifiers.

19 Claims, 7 Drawing Sheets

SLEW-RATE-ENHANCED ERROR AMP WITH ADAPTIVE TRANSCONDUCTANCE AND SINGLE DOMINANT POLE SHARED BY MAIN AND AUXILIARY AMPS

FIELD OF THE INVENTION

This invention relates to integrated circuits (IC's), and more particularly to slew-rate-enhanced amplifiers.

BACKGROUND OF THE INVENTION

Amplifiers are used in a wide variety of integrated circuits (IC's). One particular application is in a power or boost converter, where a regulated voltage such as an internal power-supply line has its voltage fed back to an error amplifier. The error amplifier compares the regulated voltage to a reference voltage. The difference or error is amplified and used to control a power transistor that adjusts the regulated voltage. The error is driven toward zero by a feedback loop.

Of course, error amplifiers may be used in other applications, such as in Analog-to-Digital Converters (ADC), boost circuits, voltage comparators, etc. While the exact design requirements for error amplifiers may vary, oftentimes an error amplifier that is stable yet has a fast response time is desirable.

Slew rates can be enhanced by increasing bias currents. However, increased bias currents can have unintended effects in error amplifiers.

Error amplifiers often use differential transistors. However, when bias currents are increased, shutting off one differential transistor or a circuit leg containing the differential transistor may be difficult. Adaptive biasing may lower the source voltages of differential transistors, causing both differential transistors to remain on. Without the extra bias current, one differential would turn off as desired.

Positive feedback may also cause stability issues in an error amplifier. Multiple stages may be used, but the extra stages complicate the circuit and increase die area and costs. Multiple dominant poles may result, creating further stability issues. Controlling the threshold for the slew rate enhancement may also be challenging. A single pole amplifier is more desirable.

A high slew rate amplifier is desired that is still stable. An error amplifier with dominant pole compensation is desirable, especially for switching power converter applications and in other high-speed systems.

DETAILED DESCRIPTION

The present invention relates to an improvement in IC amplifiers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
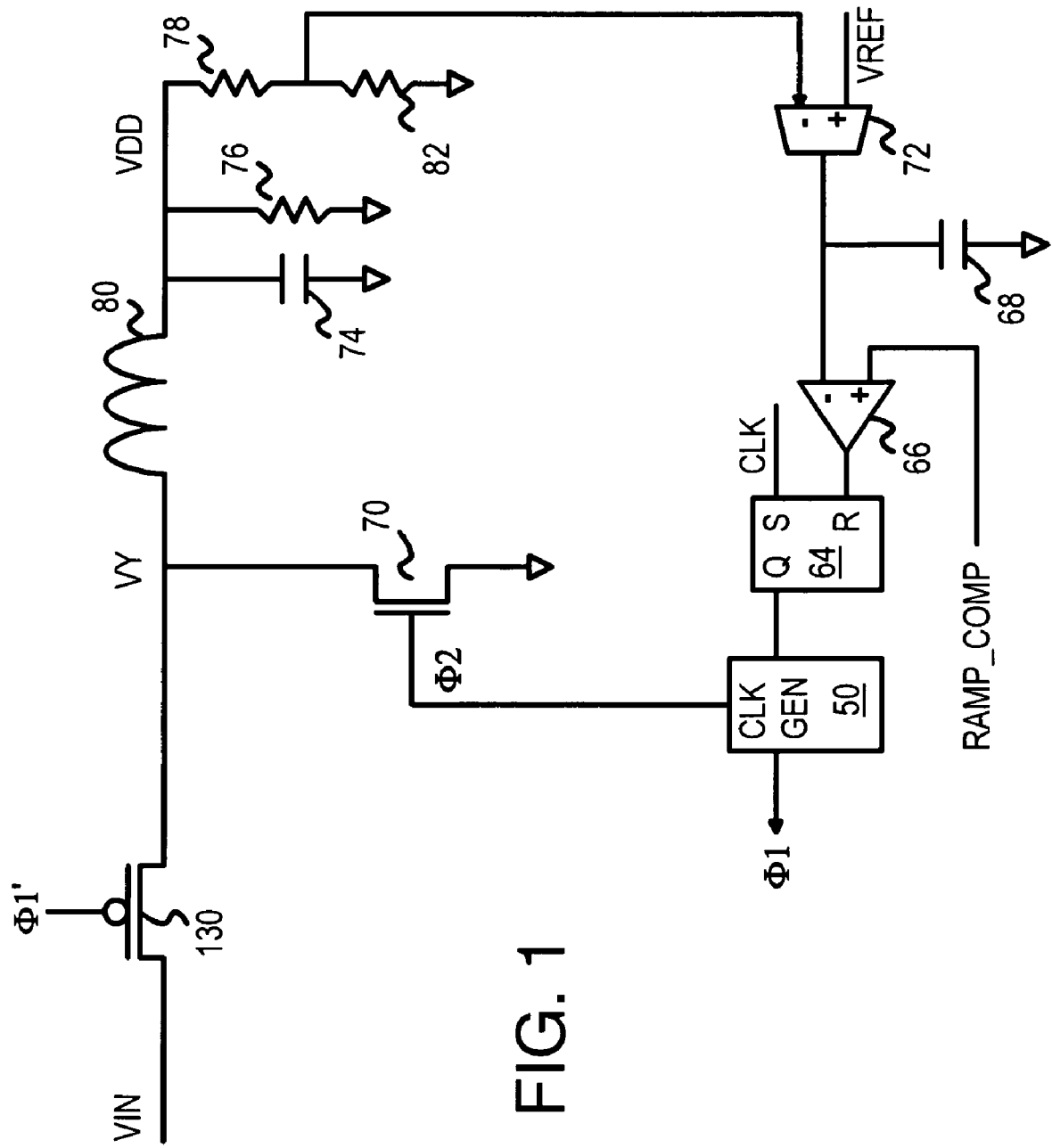
FIG. 1 is a diagram of a typical application of an error amplifier.

FIG. 1 is a diagram of a typical application of an error amplifier. Error amplifier 72 is used in a power control circuit. Error amplifier 72 should be both stable and fast in this application.

An input voltage VIN may be an unregulated or a regulated voltage that can provide a high current such as 100 mA, 600 mA, or some other value. Some portable devices may require a much lower current, such as 1 mA, but could still use this power control circuit.

The input voltage VIN is applied to p-channel power transistor 130, which turns on and conducts a power current when φ1 is active (φ1' is low). Power transistor 130 is tuned on during state S1, and the power current passes through inductor 80 and then filtered by power capacitor 74 and resistor 76. Different filter networks may be substituted. A regulated power-supply voltage VDD is obtained on the right side of p-channel power transistor 130. Inductor 80 may be placed before or after power transistor 130.

The regulated power-supply voltage VDD is divided by resistors 78, 82 to generate a voltage to the inverting input of error amplifier 72 which also receives a reference voltage VREF on its non-inverting input. Error amplifier 72 may be an operational amplifier (op amp) or other kind of amplifier or comparator, such as that described later in FIGS. 2-7.

Capacitor 68 smoothes or time-averages the amplified output of error amplifier 72, which is applied to the inverting input of comparator 66. The non-inverting input of comparator 66 receives a ramp signal RAMP_COMP, which may be generated by sensing the power current or by some other way. Set-reset SR latch 64 is periodically set by clock CLK, and is reset by the output of comparator 66.

Clock generator 50 generates clock signals φ1, φ2 that define two states S1, S2. During state S1, φ1 is active and power transistor 130 is on, driving power current through inductor 80 to VDD. During state S2, φ1 is not active, so power transistor 130 is off, but φ2 is active and n-channel sink transistor 70 is turned on, discharging voltage VY on the node between power transistor 130 and inductor 80. The voltage VY and the current through inductor 80 can be quickly adjusted by alternately turning transistors 130, 70 on and off.

The ratio of times spent in states S1, S2 can be adjusted by the control inputs to SR latch 64. When VDD is too low, such as below VREF*(R78+R82)/R82, error amplifier 72 drives a higher voltage to comparator 66, requiring a longer time for the RAMP_COMP signal to rise high enough to trigger comparator 66 to drive a high signal to the reset input of SR latch 64. The longer time before reset causes SR latch 64 to remain set longer, which keeps state S1 and φ1 active longer. The longer time for state S1 allows power transistor 130 to remain on longer, raising VY and ultimately raising VDD.

In this application and others, error amplifier 72 should be both stable and fast. A large compensating capacitor on the output of error amplifier 72 can provide stability through dominant pole compensation, but the capacitance on the output tends to slow the slew rate and thus slow down the circuit. Then feedback to power transistor 130 is delayed too much, and VDD is adjusted too slowly.

This problem is resolved by adjusting the transconductance of error amplifier 72 according to the output voltage to achieve both stability and fast transient response.

Figure 2:
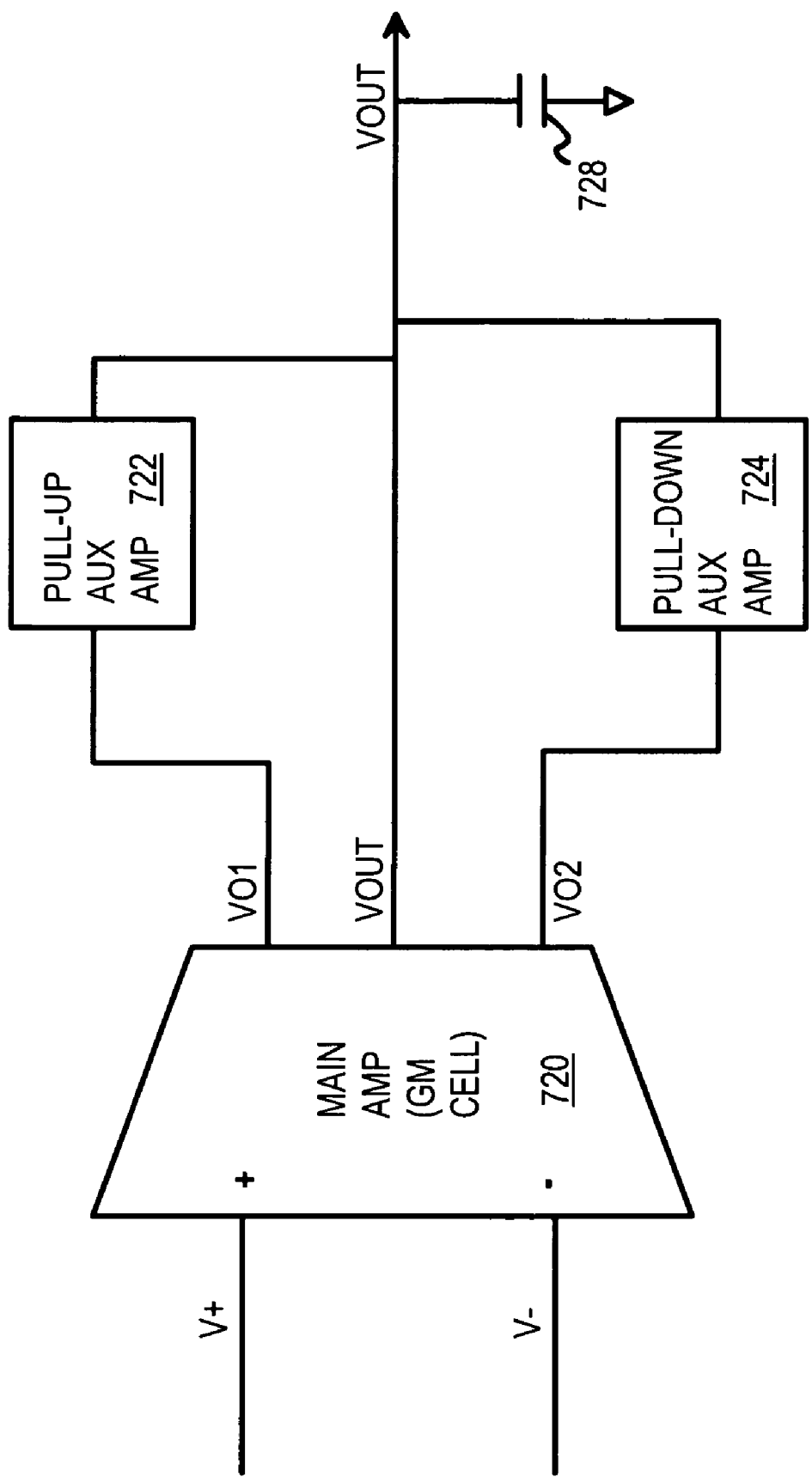
FIG. 2 is a block diagram of an error amplifier with slew rate enhancement and dominant pole compensation.

FIG. 2 is a block diagram of an error amplifier with slew rate enhancement and dominant pole compensation. The error amplifier of FIG. 2 can be used as error amplifier 72 of FIG. 1.

Input voltages V+, V− are applied as inputs to main amplifier 720, which compares these input voltages and generates output voltage VOUT. Compensating capacitor 728 on output line VOUT has a capacitance value that is selected to provide dominant pole compensation, increasing the stability of the error amplifier.

To provide a faster transient response when main amplifier 720 is switching states, auxiliary amplifiers 722, 724 are provide to boost the slew current and thus increase the slew rates. Pull-up auxiliary amplifier 722 receives VO1 from main amplifier 720 and drives a higher pull-up current to VOUT during switching of VOUT from low to high. Pull-down auxiliary amplifier 724 receives VO2 from main amplifier 720 and sinks an increased pull-down current from VOUT during switching of VOUT from high to low. Once slewing is complete, or nearing completion, auxiliary amplifiers 722, 724 shut off or reduce their current drive.

Figure 3:
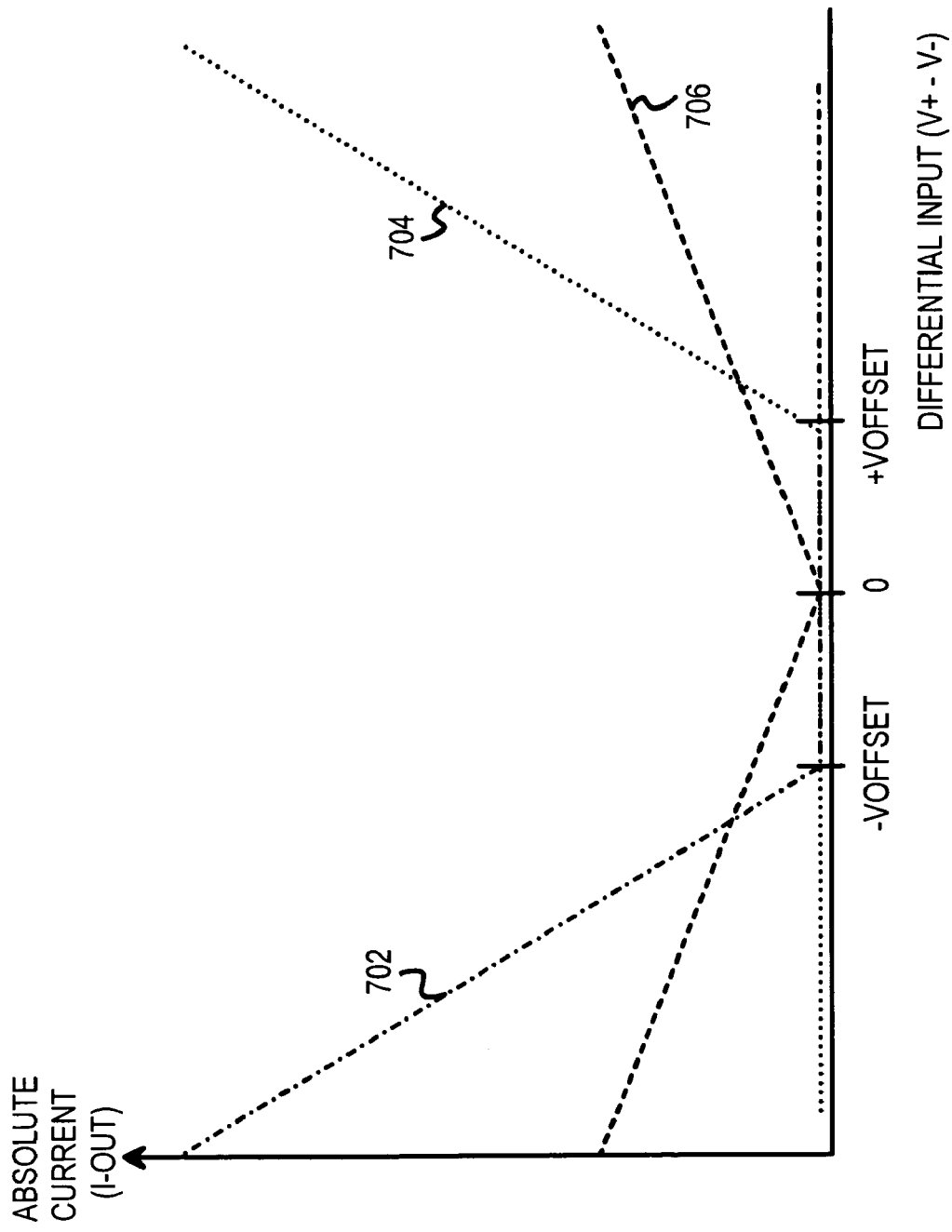
FIG. 3 is a graph of D.C. output currents in the error amplifier.

FIG. 3 is a graph of D.C. output currents in the error amplifier. The absolute value of the output current is shown on the y-axis.

Main amplifier 720 of FIG. 2 has a current 706 that is near-zero when differential inputs V+, V− are equal, or a zero voltage difference, which is indicated by the 0 on the x-axis in the middle of the graph. When the voltage difference V+, V− is positive, main current 706 increases, and when the voltage difference V+, V− is increasingly negative, the absolute value of the output current, or main current 706, also increases. However, this main current 706 is relatively small, producing relatively slow slew rates.

When the voltage difference V+, V− rises above offset voltage +VOFFSET, pull-up auxiliary amplifier 722 turns on, providing slew current 704 which is added to main current 706 to boost the overall output current. Slew current 704 rises rapidly with larger voltage differences V+, V−, providing a large slew current to quickly swing the output line VOUT high.

When the voltage difference V+, V− rises below offset voltage—VOFFSET, pull-down auxiliary amplifier 724 turns on, providing slew current 702 which is added to main current 706 to boost the overall output current. Slew current 702 increases rapidly with larger negative voltage differences V+, V−, providing a large slew current to quickly swing the output line VOUT low.

When the absolute voltage difference V+, V− is less than VOFFSET, pull-up auxiliary amplifier 722 and pull-down auxiliary amplifier 724 are both turned off.

Figure 4:
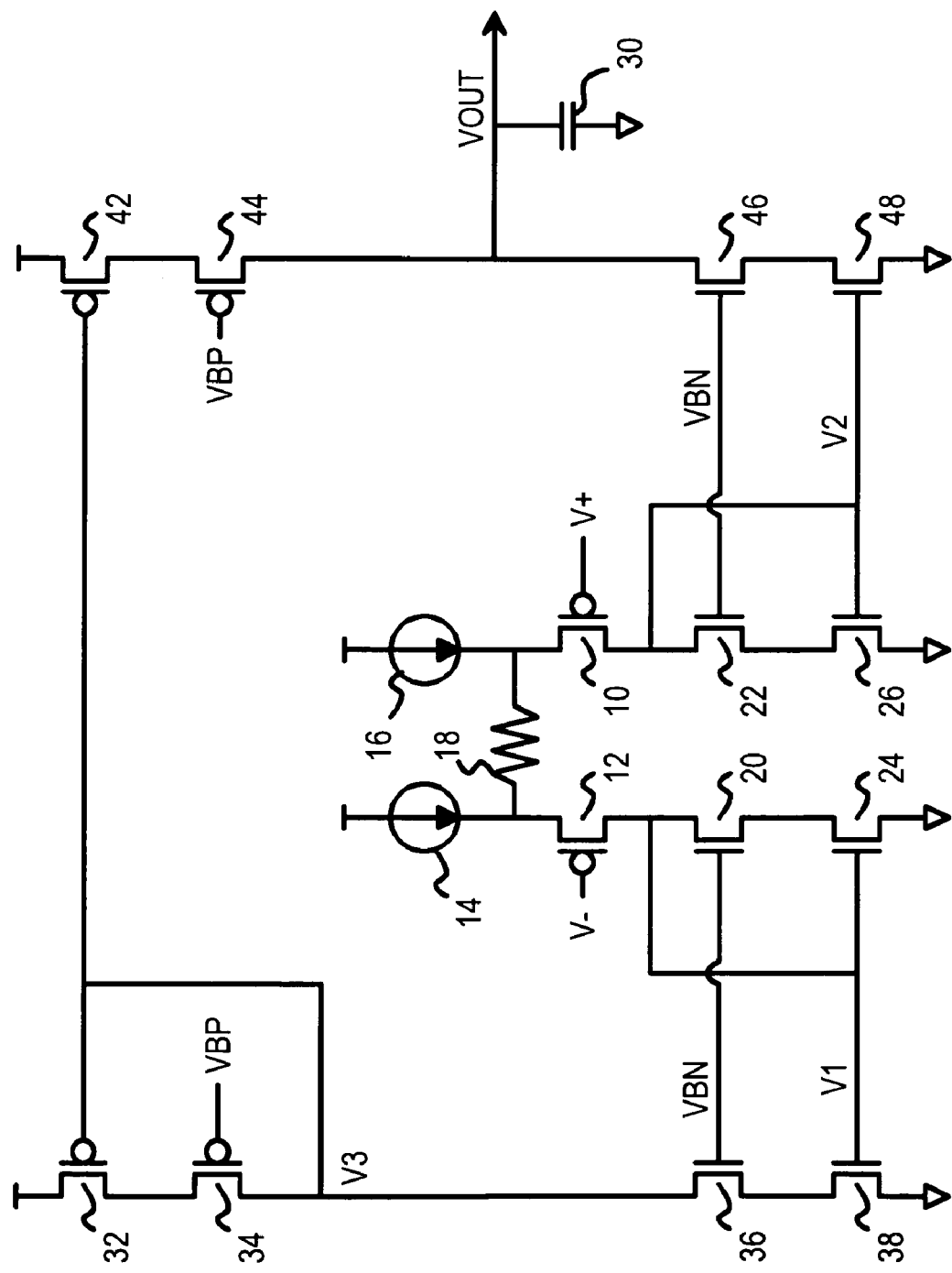
FIG. 4 is a schematic of a main amplifier.

FIG. 4 is a schematic of a main amplifier. FIG. 4 shows a circuit schematic of an implementation of main amplifier 720 of FIG. 2. Current source 14 supplies current to the source of p-channel differential transistor 12, which receives input voltage V− on its gate and has a drain connected to node V1. Node V1 is also the drain of n-channel cascode transistor 20, which passes its current to n-channel sink transistor 24. Node V1 is also the gate of n-channel sink transistor 24.

Current source 16 supplies current to the source of p-channel differential transistor 10, which receives input voltage V+ on its gate and has a drain connected to node V2. Node V2 is also the drain of n-channel cascode transistor 22, which passes its current to n-channel sink transistor 26. Node V2 is also the gate of n-channel sink transistor 26.

Node V1 mirrors the gate voltage of n-channel sink transistor 24 to n-channel mirror transistor 38, which has its source grounded. The drain of n-channel mirror transistor 38 connects to the source of n-channel cascode transistor 36, which has its drain connecting to the drain of p-channel cascode transistor 34 as node V3. Node V3 is also the gate of p-channel source transistor 32, which sources current to p-channel cascode transistor 34.

Node V2 mirrors the gate voltage of n-channel sink transistor 26 to n-channel mirror transistor 48, which has its source grounded. The drain of n-channel mirror transistor 48 connects to the source of n-channel cascode output transistor 46, which has its drain connecting to the drain of p-channel cascode output transistor 44 as output node VOUT. P-channel mirror transistor 42 has a gate connected to node V3 and sources current to p-channel cascode output transistor 44.

The gates of p-channel cascode transistors 34, 44 are driven by cascode bias voltage VBP, while the gates of n-channel cascode transistors 20, 22, 36, 46 are driven by cascode bias voltage VBN. Bias voltages VBP, VBN can be generated by a voltage divider or other bias generator. Current sources 14, 16 can be implemented as p-channel transistors with gates biased by another fixed bias voltage near VDD. The output impedance of VOUT and gain of the amplifier are enhanced by using cascode transistors.

Compensating capacitor 30 connects to VOUT and sets the dominant pole of the amplifier. The exact capacitance value can be determined by simulation or by other means. The main amplifier has a single dominant pole.

Source degenerated resistor 18 connects between the sources of p-channel differential transistors 10, 12. Source degenerated resistor 18 improves linearity of the amplifier and reduces supply headroom of the error amplifier.

The current through the circuit legs containing differential transistors 10, 12 can be larger than the current through the mirror and output legs containing mirror transistor 38 and the output leg containing mirror transistor 48 and output cascode transistors 44, 46. For example, mirror transistors 24, 26 can be the same W/L size 4X, while mirror transistors 38, 48 can be the same W/L size X, so that the current through mirror transistors 38, 48 is one-quarter the current through mirror transistors 24, 26. Thus current is scaled down in the main amplifier. This produces a lower transconductance gm. The lower transcondutance improves stability but decreases speed.

The variation in current through the differential legs and differential transistors 10, 12 is copied to the mirror and output legs, but scaled down by a factor of four in this example. Having a single pair of differential transistors 10, 12 minimizes any input offset error due to mis-matching of transistors, since only 1 pair of transistors is used rather than 2 or more pairs.

Figure 5:
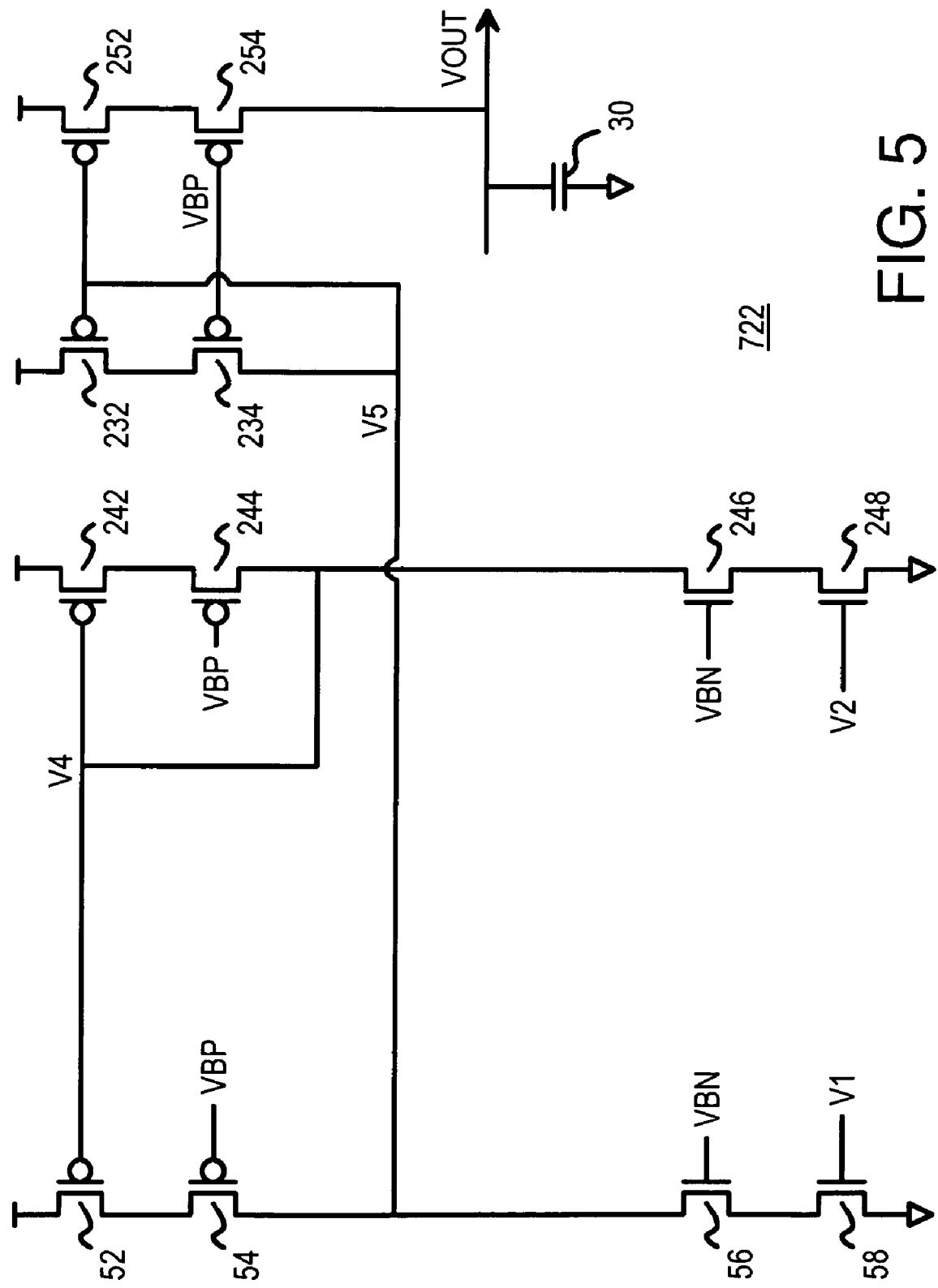
FIG. 5 is a schematic of a pull-up auxiliary amplifier.

FIG. 5 is a schematic of a pull-up auxiliary amplifier. FIG. 5 shows a circuit schematic of an implementation of pull-up auxiliary amplifier 722 of FIG. 2. Mirror node V1 generated by the main amplifier of FIG. 4 is applied to the gate of n-channel mirror transistor 58, while mirror node V2 is applied to the gate of n-channel mirror transistor 248. Cascode bias voltage VBN is applied to the gates of n-channel cascode transistors 56, 246, while cascode bias voltage VBP is applied to the gates of p-channel cascode transistors 54, 244, 234, 254.

A first leg of p-channel source transistor 52, p-channel cascode transistor 54, n-channel cascode transistor 56, and n-channel mirror transistor 58, connected in series between power and ground, produces node V5 in the middle, at the drains of cascode transistors 54, 56. A second leg of p-channel source transistor 242, p-channel cascode transistor 244, n-channel cascode transistor 246, and n-channel mirror transistor 248, connected in series between power and ground, produces node V4 in the middle, at the drains of cascode transistors 244, 246. Node V4 drives the gates of p-channel source transistors 52, 242.

Node V5 is applied as the gates of p-channel source transistors 232, 252, which source current to the channels of p-channel cascode transistors 234, 254, respectively. The drain of p-channel cascode transistor 234 also connects to node V5, but the drain of p-channel cascode transistor 254 drives output current to output VOUT. This output current increases the slew rate, allowing any output loads and compensating capacitor 30 to be charged more quickly.

The ratio of W/L size of p-channel source transistors 252 to the W/L size of p-channel source transistor 232 is K:1. The ratio of W/L size of n-channel mirror transistor 58 to the W/L size of n-channel mirror transistor 38 in the main amplifier of FIG. 4 is 2:1. Other ratio sizes may be used. Other transistors in the same leg are ratioed in a similar manner to corresponding transistors in other legs, so that the currents also have the 2:1 and K:1 ratios. The gain of pull-up auxiliary amplifier 722 is K times the gain of the main amplifier 720, or 2*K*gm, in this example. K can be a sufficiently large number (such as 10×) so that a large slew current is provided by pull-up auxiliary amplifier 722.

Figure 6:
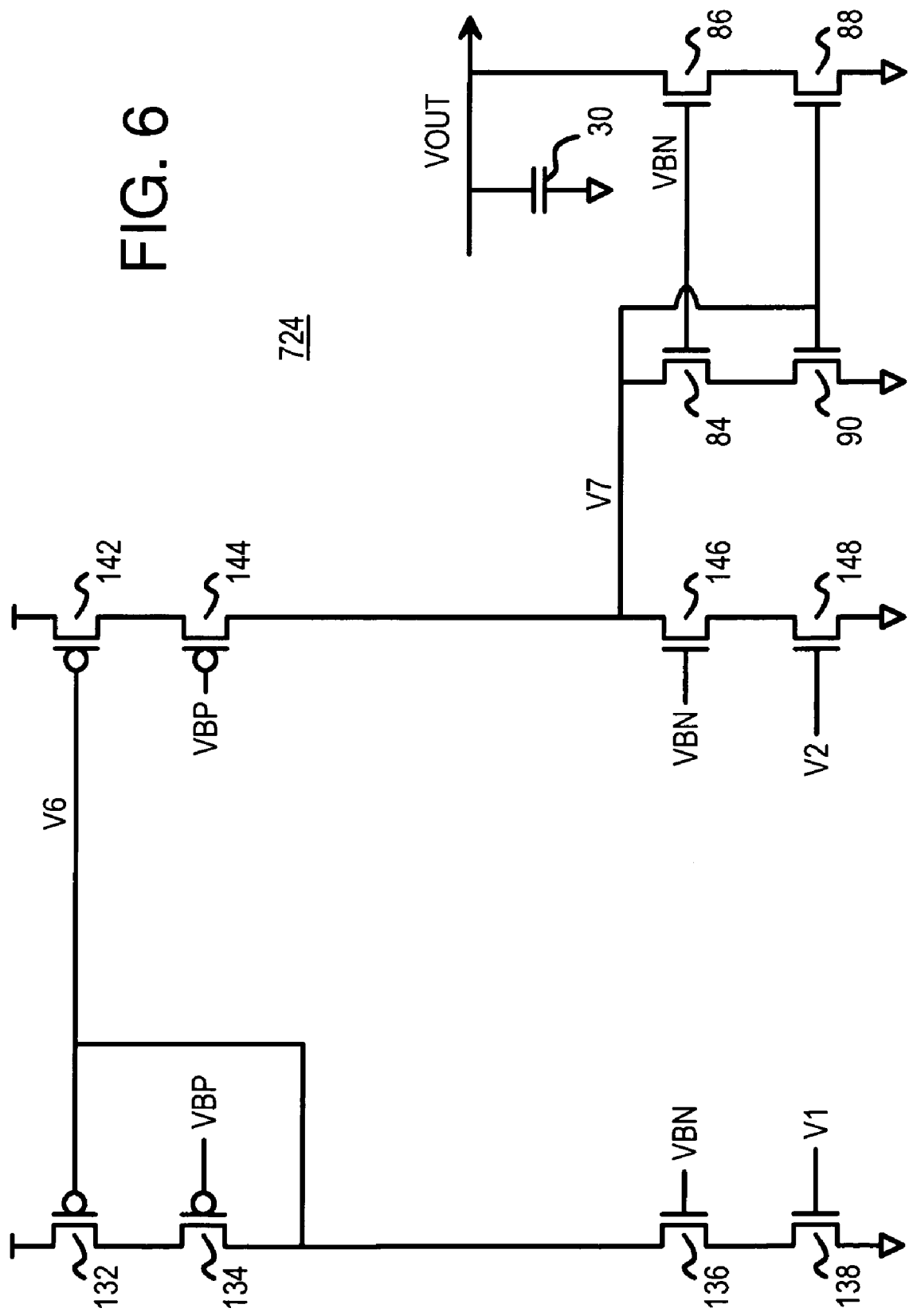
FIG. 6 is a schematic of a pull-down auxiliary amplifier.

FIG. 6 is a schematic of a pull-down auxiliary amplifier. FIG. 6 shows a circuit schematic of an implementation of pull-down auxiliary amplifier 724 of FIG. 2. Mirror node VI generated by the main amplifier of FIG. 4 is applied to the gate of n-channel mirror transistor 138, while mirror node V2 is applied to the gate of n-channel mirror transistor 148. Cascode bias voltage VBN is applied to the gates of n-channel cascode transistors 136, 146, 84, 86, while cascode bias voltage VBP is applied to the gates of p-channel cascode transistors 134, 144.

A first leg of p-channel source transistor 132, p-channel cascode transistor 134, n-channel cascode transistor 136, and n-channel mirror transistor 138, connected in series between power and ground, produces node V6 in the middle, at the drains of cascode transistors 134, 136. A second leg of p-channel source transistor 142, p-channel cascode transistor 144, n-channel cascode transistor 146, and n-channel mirror transistor 148, connected in series between power and ground, produces node V7 in the middle, at the drains of cascode transistors 144, 146. Node V6 drives the gates of p-channel source transistors 132, 142.

Node V7 is applied as the gates of n-channel sink transistors 90, 88, which sink current from the channels of n-channel cascode transistors 84, 86, respectively. The drain of n-channel cascode transistor 84 also connects to node V7, but the drain of n-channel cascode transistor 86 sinks output current from output VOUT. This output current increases the slew rate, allowing any output loads and compensating capacitor 30 to be charged more quickly.

The ratio of W/L size of n-channel sink transistors 88 to the W/L size of n-channel sink transistor 90 is K:1. The ratio of W/L size of n-channel mirror transistor 138 to the W/L size of n-channel mirror transistor 38 in the main amplifier of FIG. 4 is 2:1. Other ratio sizes may be used. Other transistors in the same leg are ratioed in a similar manner to corresponding transistors in other legs, so that the currents also have the 2:1 and K:1 ratios. The gain of pull-down auxiliary amplifier 724 is K times the gain of the main amplifier 720, or 2*K*gm, in this example. K can be a sufficiently large number, such as 10×, so that a large slew current is provided by pull-down auxiliary amplifier 724.

Pull-up slew current in pull-up auxiliary amplifier 722 can be scaled independently of the pull-down slew current in pull-down auxiliary amplifier 724, rather than both having a K:1 ratio. An intentional input offset can be introduced into the error amplifier by adjusting the sizes of some transistors. For example, the ratio of sizes of p-channel source transistor 142 can be adjusted relative to the size of n-channel mirror transistor 148 in the second leg, rather than both be sized for the same current.

An input offset of 30 mV can be easily introduced for a variety of purposes. A similar offset could be introduced in pull-up auxiliary amplifier 722. These offsets in the auxiliary amplifiers ensure that they do not turn on for small voltage differences, such as shown in the graph of FIG. 3, where VOFFSET is introduced.

Figure 7:
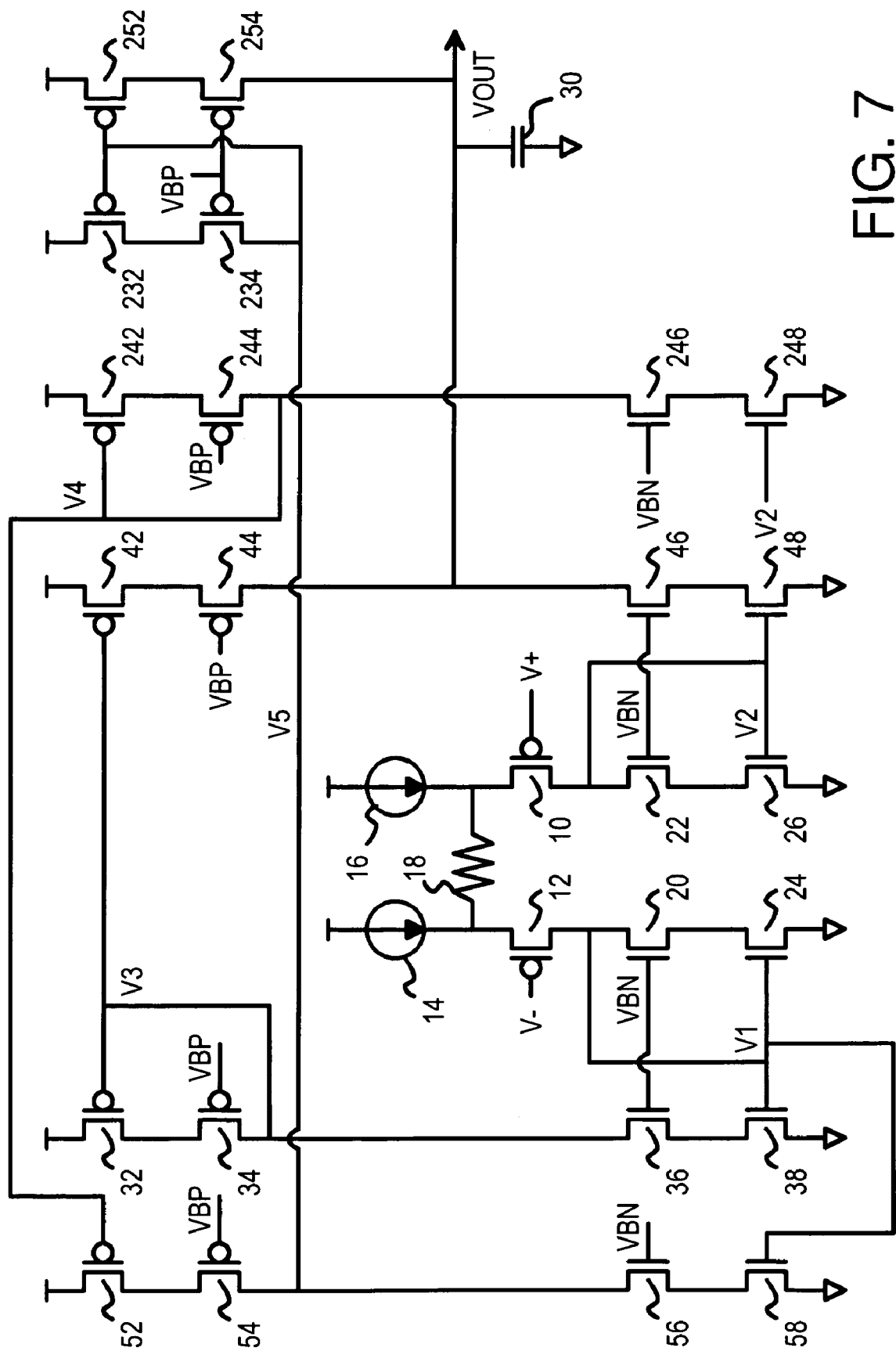
FIG. 7 is an alternate embodiment of the error amplifier.

FIG. 7 is an alternate embodiment of the error amplifier. In this alternative, pull-up auxiliary amplifier 722 is present but pull-down auxiliary amplifier 724 is deleted. Reference numbers for transistors are the same as described earlier for FIGS. 4-5. This reduces chip area, cost, and power by roughly one-third, but does not provide overshoot protection.

Alternate Embodiments

Several other embodiments are contemplated by the inventors. For example, only pull-down auxiliary amplifier 724 may be present and not pull-up auxiliary amplifier 722. The auxiliary amplifiers share the same dominant pole with main amplifier 720, and a standard compensation technique can be used when setting the capacitance value of compensating capacitor 30. There is no positive feedback loop, so stability is further enhanced. When K=10, gm can be 0.37 µA/V, and Kgm=3.7 µA/V in one process technology. Undershoot can be corrected by pull-up auxiliary amplifier 722 while overshoot is corrected by pull-down auxiliary amplifier 724.

By introducing an input offset into pull-up auxiliary amplifier 722 and pull-down auxiliary amplifier 724, these auxiliary amplifiers turn off when the differential input is less than the offset. Thus the stability of the main loop is not affected by the auxiliary amplifiers. The input offset can be 30 mV or some other value, and can be set by adjusting p-channel and n-channel transistor sizes from values that would otherwise produce the same channel current given the gate, source, and drain bias voltages.

If V+, V− has a large voltage difference, pull-up auxiliary amplifier 722 remains on and Vout is charged up to VDD. After Vout is charged up to VDD, p-channel transistor 254 is forced to be OFF as Vds of this transistor becomes zero. If the output is finished slewing, V+ and V− are stable and very close to each other. The voltage different between V+ and V− is VDD/(gain of the main amplifier). For example, if VDD=3.3V, the gain of the main amplifier is 500. The voltage difference of V+ and V− is ±6 mV, which is much less than 30 mV.

Simulation shows that transient responses can be reduced from 1 ms with only main amplifier 720 down to 130 µs with the aid of pull-down auxiliary amplifier 724. The ratio of the p-channel transistor to the n-channel transistor, or to the same kind of transistor in different legs, such as n-channel mirror transistors, is a ratio of W/L sizes, wherein W is a width of a transistor channel and L is a length of the transistor channel.

Capacitors, resistors, and other filter elements may be added. Switches could be added, such as n-channel transistors, p-channel transistors, or transmission gates with parallel n-channel and p-channel transistors. Circuits may be inverted and use n-channel rather than p-channel transistors, and use p-channel rather than n-channel transistors. Wells or substrates under transistors may be connected to a common bias voltage, or each transistor may connect its source and well together. Various combinations may be used. The V+, V− inputs may be swapped to invert the error amplifier output, or V1, V2 may be swapped, or other internal connections swapped.

The offset voltage can be introduced by varies components. Source degenerated resistor 18 and current source 16 can be removed and the tail current can be provide by transistors 14 to 12 and 10 solely. The cascode structure can be removed if VDD is low or the gain for the main amplifier is sufficient for the application.

In FIG. 1, the reference voltage VREF to voltage-sensing amplifier 72 can be determined by simulation, such as 1.23 volts. The exact timing may be changed, and delays to produce non-overlapping clocks may be adjusted or eliminated. Other trigger and compare circuits could be substituted, such as using clock and reset inputs of a D-type flip-flop with the D-input grounded rather than SR latch 64. Other kinds of bi-stable elements could also be substituted. Clock generator 50 can use standard inverters and buffers or logic gates to produce the desired delays and clocks.

Some components may not be present in a real circuit, but are idealized components in the schematics. For example, resistor 76 may represent a load by an actual device that may have thousands of transistors in complex arrangements rather than a single resistor to ground. Components such as may be deleted or implemented as part of other circuits.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes.

While an operational amplifier (op amp) has been described, other kinds of comparators could be used, such as non-amplifying compare buffers. Many circuit types may be used for amplifiers, such as folded cascode, source-followers, differential, etc.

While Complementary-Metal-Oxide-Semiconductor (CMOS) transistors have been described, other transistor technologies and variations may be substituted, and materials other than silicon may be used, such as Galium-Arsinide (GaAs) and other variations.

While positive currents have been described, currents may be negative or positive, as electrons or holes may be considered the carrier in some cases. Charging and discharging may be interchangeable terms when referring to carriers of opposite polarity. Currents may flow in the reverse direction. Clocks may be active in the high state or active in the low state and can be inverted, buffered, or qualified with other signals such as with logic gates.

The generated power supply VDD may be less than 2.0 volts, such as 1.8 volts, 1.5 volts, 1.2 volts, or 1.0 volts, or may be higher values such as 2.6-3.7 volts. The input power voltage VIN may be a volt or so higher, such as 5 volts or 3 volts. Offset voltage 57 may be about equal to the transistor threshold, such as about 0.5 volts, and may vary with conditions rather than be a fixed voltage offset.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An error amplifier comprising:
a main amplifier that receives a differential input voltage that is a difference in voltages of a first differential input and a second differential input, the main amplifier driving an output;
a compensating capacitor connected to the output, the compensating capacitor having a capacitance value that sets a single dominant pole in the error amplifier;
a pull-up auxiliary amplifier that drives a pull-up slew current to the output when triggered by the main amplifier;
a pull-down auxiliary amplifier that drives a pull-down slew current to the output when triggered by the main amplifier;
a first intentional offset introduced into the pull-up auxiliary amplifier by changing a ratio of a p-channel transistor to an n-channel transistor in a same leg of transistors in the pull-up auxiliary amplifier so that the pull-up auxiliary amplifier drives the pull-up slew current to the output when the differential input voltage exceeds the first intentional offset; and
a second intentional offset introduced into the pull-down auxiliary amplifier by changing a ratio of a p-channel transistor to an n-channel transistor in a same leg of transistors in the pull-down auxiliary amplifier so that the pull-down auxiliary amplifier drives the pull-down slew current to the output when the differential input voltage is more negative than the second intentional offset, whereby stability is achieved by the single dominant pole and speed is increased by the pull-up slew current from the pull-up auxiliary amplifier and the pull-down slew current from the pull-down auxiliary amplifier and whereby the pull-up auxiliary amplifier and the pull-down auxiliary amplifier turn on when intentional offsets are exceeded.

2. The error amplifier of claim 1 wherein the ratio of the p-channel transistor to the n-channel transistor is a ratio of W/L sizes, wherein W is a width of a transistor channel and L is a length of the transistor channel.

3. The error amplifier of claim 1 wherein the main amplifier further comprises:
   a first current source driving a first current to a first source node;
   a first differential transistor having a channel between the first source node and a first minor-gate node, the channel controlled by a gate receiving the first differential input;
   a second current source driving a second current to a second source node;
   a second differential transistor having a channel between the second source node and a second minor-gate node, the channel controlled by a gate receiving the second differential input;
   a source degenerated resistor coupled between the first source node and the second source node;
   a first leg of transistors in series between a power supply and a ground, the first leg comprising a first mirror transistor that has a gate receiving the first minor-gate node, the first leg generating a first leg voltage on a first leg node; and
   an output leg of transistors in series between the power supply and the ground, the output leg driving the output and comprising a second mirror transistor that has a gate receiving the second minor-gate node, and a second leg transistor having a gate connected to the first leg node.

4. The error amplifier of claim 3 wherein the main amplifier further comprises:
   a first interior minor transistor having a gate connected to the first mirror-gate node, for conducting current between a first interior cascode node and a first supply voltage;
   a first interior cascode transistor having a gate driven by a first cascode voltage, for conducting current between the first minor-gate node and the first interior cascode node;
   a second interior minor transistor having a gate connected to the second mirror-gate node, and a channel between a second interior cascode node and the first supply voltage; and
   a second interior cascode transistor having a gate driven by the first cascode voltage, and a channel between the second minor-gate node and the second interior cascode node.

5. The error amplifier of claim 4 wherein the first leg of transistors further comprises:
   a first leg transistor having a gate connected to the first leg node, and a channel between a second supply voltage and a second exterior cascode node;
   a second leg cascode transistor having a gate driven by a second cascode voltage, and a channel between the second exterior cascode node and the first leg node;
   a first leg cascode transistor having a gate driven by the first cascode voltage, and a channel between a first exterior cascode node and the first leg node;
   wherein the first mirror transistor has a gate receiving the first mirror-gate node that controls a channel between the first exterior cascode node and the first supply voltage.

6. The error amplifier of claim 5 wherein the output leg of transistors further comprises:
   a second output cascode transistor having a gate driven by the second cascode voltage, and a channel between a second output cascode node and the output; and
   a first output cascode transistor having a gate driven by the first cascode voltage, and a channel between a first output cascode node and the output;
   wherein the second leg transistor has a gate connected to the first leg node, and a channel between the second supply voltage and the second output cascode node;
   wherein the second mirror transistor has a gate receiving the second mirror-gate node and a channel between the first output cascode node and the first supply voltage.

7. The error amplifier of claim 6 wherein the first differential transistor and the second differential transistor each comprise a p-channel transistor.

8. The error amplifier of claim 7 wherein the first interior mirror transistor, the second interior minor transistor, the first interior cascode transistor, and the second interior cascode transistor each comprise an n-channel transistor.

9. The error amplifier of claim 8 wherein the first leg transistor, the second leg cascode transistor, the second leg transistor, and the second output cascode transistor each comprise a p-channel transistor;
   wherein the first mirror transistor, the second minor transistor, the first leg cascode transistor, and the first output cascode transistor each comprise an n-channel transistor.

10. The error amplifier of claim 9 wherein the first supply voltage is the ground and the second supply voltage is the power supply.

11. The error amplifier of claim 6 wherein the pull-up auxiliary amplifier further comprises:
    a first pull-up leg of transistors in series between the power supply and the ground, the first pull-up leg comprising a first pull-up mirror transistor that has a gate receiving the first minor-gate node, and a first pull-up leg transistor having a gate connected to a second pull-up leg node, the first pull-up leg generating a first pull-up leg voltage on a first pull-up leg node;
    a second pull-up leg of transistors in series between the power supply and the ground, the second pull-up leg comprising a second pull-up mirror transistor that has a gate receiving the second minor-gate node, the second pull-up leg generating a second pull-up leg voltage on the second pull-up leg node;
    an output pull-up leg of transistors in series between the power supply and the output, the output pull-up leg driving the output and comprising an output pull-up mirror transistor that has a gate receiving the first pull-up leg node.

12. The error amplifier of claim 11 wherein the pull-down auxiliary amplifier further comprises:
    a first pull-down leg of transistors in series between the power supply and the ground, the first pull-down leg comprising a first pull-down mirror transistor that has a gate receiving the second minor-gate node, and a first pull-down leg transistor having a gate connected to a second pull-down leg node, the first pull-down leg generating a first pull-down leg voltage on a first pull-down leg node;
    a second pull-down leg of transistors in series between the power supply and the ground, the second pull-down leg comprising a second pull-down minor transistor that has a gate receiving the first mirror-gate node, the second pull-down leg generating a second pull-down leg voltage on the second pull-down leg node;

an output pull-down leg of transistors in series between the output and the ground, the output pull-down leg driving the output and comprising an output pull-down minor transistor that has a gate receiving the first pull-down leg node.

13. An amplifier comprising:

a first current source driving a first current to a first source node;

a first differential transistor having a channel between the first source node and a first minor-gate node, the channel controlled by a gate receiving a first differential input;

a second current source driving a second current to a second source node;

a second differential transistor having a channel between the second source node and a second minor-gate node, the channel controlled by a gate receiving a second differential input;

a source degenerated resistor coupled between the first source node and the second source node;

a first interior minor transistor having a gate connected to the first mirror-gate node, and a channel between a first cascode node and a first supply voltage;

a first interior cascode transistor having a gate driven by a first cascode voltage, and a channel between the first mirror-gate node and the first cascode node;

a second interior minor transistor having a gate connected to the second mirror-gate node, and a channel between a second cascode node and the first supply voltage;

a second interior cascode transistor having a gate driven by the first cascode voltage, and a channel between the second minor-gate node and the second cascode node;

a first leg transistor having a gate connected to a first leg node, and a channel between a second supply voltage and a second exterior cascode node;

a second leg cascode transistor having a gate driven by a second cascode voltage, and a channel between the second exterior cascode node and the first leg node;

a first leg cascode transistor having a gate driven by the first cascode voltage, and a channel between a first exterior cascode node and the first leg node;

a first mirror transistor having a gate receiving the first mirror-gate node and a channel between the first exterior cascode node and the first supply voltage;

a second output cascode transistor having a gate driven by the second cascode voltage, and a channel between a second output cascode node and an output;

a first output cascode transistor having a gate driven by the first cascode voltage, and a channel between a first output cascode node and the output;

a second leg transistor having a gate connected to the first leg node, and a channel between the second supply voltage and the second output cascode node;

a second mirror transistor having a gate receiving the second mirror-gate node and a channel between the first output cascode node and the first supply voltage; and a pull-up auxiliary amplifier receiving the first minor-gate node and the second mirror-gate node, for driving a pull-up current to the output.

14. The amplifier of claim 13 wherein the pull-up auxiliary amplifier further comprises:

a first pull-up leg of transistors in series between the first supply voltage and the second supply voltage, the first pull-up leg comprising a first pull-up minor transistor that has a gate receiving the first minor-gate node, and a first pull-up leg transistor having a gate connected to a second pull-up leg node, the first pull-up leg generating a first pull-up leg voltage on a first pull-up leg node;

a second pull-up leg of transistors in series between the first supply voltage and the second supply voltage, the second pull-up leg comprising a second pull-up minor transistor that has a gate receiving the second mirror-gate node, the second pull-up leg generating a second pull-up leg voltage on the second pull-up leg node;

an output pull-up leg of transistors in series between the first supply voltage and the output, the output pull-up leg driving the output and comprising an output pull-up minor transistor that has a gate receiving the first pull-up leg node.

15. The amplifier of claim 13 wherein the pull-up auxiliary amplifier further comprises:

a first pull-up leg transistor having a gate connected to a second pull-up leg node, and a channel between the second supply voltage and a third node;

a second pull-up cascode transistor having a gate receiving the second cascode voltage and a channel between the third node and a first pull-up leg node;

a first pull-up cascode transistor having a gate receiving the first cascode voltage and a channel between a fourth node and the first pull-up leg node;

a first pull-up mirror transistor that has a gate receiving the first minor-gate node, and a channel between the first supply voltage and the fourth node;

a second pull-up leg transistor having a gate connected to the second pull-up leg node, and a channel between the second supply voltage and a fifth node;

a third pull-up cascode transistor having a gate receiving the second cascode voltage and a channel between the fifth node and the second pull-up leg node;

a fourth pull-up cascode transistor having a gate receiving the first cascode voltage and a channel between a sixth node and the second pull-up leg node;

a second pull-up mirror transistor that has a gate receiving the second minor-gate node, and a channel between the first supply voltage and the sixth node;

an output pull-up minor transistor that has a gate receiving the first pull-up leg node, and a channel between the second supply voltage and a seventh node; and a fifth pull-up cascode transistor having a gate receiving the second cascode voltage and a channel between the seventh node and the output.

16. The amplifier of claim 15 wherein the first interior mirror transistor, the second interior mirror transistor, the first interior cascode transistor, and the second interior cascode transistor, the first minor transistor, the second mirror transistor, the first leg cascode transistor, and the first output cascode transistor each comprise an n-channel transistor;

wherein the first differential transistor and the second differential transistor, the first leg transistor, the second leg cascode transistor, the second leg transistor, and the second output cascode transistor each comprise a p-channel transistor;

wherein the first pull-up leg transistor, the second pull-up leg transistor, the second pull-up cascode transistor, the third pull-up cascode transistor, the fifth pull-up cascode transistor, and the second pull-up minor transistor each comprise a p-channel transistor;

wherein the first pull-up cascode transistor, the first pull-up minor transistor, the fourth pull-up cascode transistor, and the second pull-up minor transistor each comprise an n-channel transistor.

17. A differential amplifier comprising:

first current source means for driving a first current to a first source node;

first differential transistor means for conducting current between the first source node and a first mirror-gate node in response to a gate receiving a first differential input;

second current source means for driving a second current to a second source node;

second differential transistor means for conducting current between the second source node and a second mirror-gate node in response to a gate receiving a second differential input;

source degenerated resistor means, coupled between the first source node and the second source node, for improving amplifier linearity;

first interior mirror transistor means, responsive to a gate connected to the first mirror-gate node, for conducting current between a first cascode node and a first supply node;

first interior cascode transistor means, responsive to a gate driven by a first cascode voltage, for conducting current between the first minor-gate node and the first cascode node;

second interior mirror transistor means, responsive to a gate connected to the second minor-gate node, for conducting current between a second cascode node and the first supply node;

second interior cascode transistor means, responsive to a gate driven by the first cascode voltage, for conducting current between the second minor-gate node and the second cascode node;

first leg transistor means, responsive to a gate connected to a first leg node, for conducting current between a second supply node and a second exterior cascode node;

second leg cascode transistor means, responsive to a gate driven by a second cascode voltage, for conducting current between the second exterior cascode node and the first leg node;

first leg cascode transistor means, responsive to a gate driven by the first cascode voltage, for conducting current between a first exterior cascode node and the first leg node;

first minor transistor means, responsive to a gate receiving the first minor-gate node and a channel between the first exterior cascode node and the first supply node;

second output cascode transistor means, responsive to a gate driven by the second cascode voltage, for conducting current between a second output cascode node and an output;

first output cascode transistor means, responsive to a gate driven by the first cascode voltage, for conducting current between a first output cascode node and the output;

second leg transistor means, responsive to a gate connected to the first leg node, for conducting current between the second supply node and the second output cascode node;

second minor transistor means, responsive to a gate receiving the second minor-gate node and a channel between the first output cascode node and the first supply node; and pull-up auxiliary amplifier means, receiving the first minor-gate node and the second minor-gate node, for driving a pull-up current to the output.

18. The differential amplifier of claim 17 wherein the pull-up auxiliary amplifier means further comprises:

first pull-up leg transistor means, having a gate connected to a second pull-up leg node, for conducting current between the second supply node and a third node;

second pull-up cascode transistor means, having a gate receiving the second cascode voltage, for conducting current between the third node and a first pull-up leg node;

first pull-up cascode transistor means, having a gate receiving the first cascode voltage, for conducting current between a fourth node and the first pull-up leg node;

first pull-up minor transistor means, having a gate receiving the first mirror-gate node, for conducting current between the first supply node and the fourth node;

second pull-up leg transistor means, having a gate connected to the second pull-up leg node, for conducting current between the second supply node and a fifth node;

third pull-up cascode transistor means, having a gate receiving the second cascode voltage, for conducting current between the fifth node and the second pull-up leg node;

fourth pull-up cascode transistor means, having a gate receiving the first cascode voltage, for conducting current between a sixth node and the second pull-up leg node;

second pull-up minor transistor means, having a gate receiving the second mirror-gate node, for conducting current between the first supply node and the sixth node;

output pull-up mirror transistor means, having a gate receiving the first pull-up leg node, for conducting current between the second supply node and a seventh node; and fifth pull-up cascode transistor means, having a gate receiving the second cascode voltage, for conducting current between the seventh node and the output.

19. The differential amplifier of claim 17 further comprising:

power transistor means, having a gate receiving a first clock, for conducting a power current from a power input to a power node when the first clock is active during a first state and for isolating the power input from the power node during a second state;

bistable means for being triggered into the first state by a periodic clock and for being triggered into the second state by a sense node;

clock generator means, responsive to the bistable means, for activating the first clock in response to the second state, and for activating a second clock in response to the first state, power sink transistor means, having a gate receiving the second clock, for conducting current from the power node when the second clock is active during the second state;

inductor means coupled in series with the power transistor means, for controlling current to the power node;

a power capacitor coupled to the power node;

voltage divider means, coupled to the power node, for generating a voltage-sensed voltage on the first differential input to the differential amplifier, wherein a reference voltage is applied to the second differential input to the differential amplifier; and third comparator means for comparing the output from the differential amplifier to the sense node to generate a reset signal to the bistable means, whereby both a voltage-sensed trigger from the power node and a current-sensed trigger are combined to trigger the bistable means.

* * * * *